United States Patent
Kim et al.

(10) Patent No.: US 10,778,205 B2
(45) Date of Patent: Sep. 15, 2020

(54) PULSE AMPLITUDE MODULATION TRANSMITTER AND PULSE AMPLITUDE MODULATION RECEIVER

(71) Applicant: SAMSUNG ELECTRONICS CO., LTD., Suwon-si, Gyeonggi-Do (KR)

(72) Inventors: Sung-Ha Kim, Yongin-si (KR); Jung Hoon Chun, Suwon-si (KR); Hwaseok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/393,702

(22) Filed: Apr. 24, 2019

(65) Prior Publication Data
US 2019/0253044 A1   Aug. 15, 2019

Related U.S. Application Data

(63) Continuation of application No. 15/924,561, filed on Mar. 19, 2018, now Pat. No. 10,312,896.

(30) Foreign Application Priority Data

Aug. 7, 2017   (KR) .................. 10-2017-0099847

(51) Int. Cl.
| H03K 7/02 | (2006.01) |
| H04B 14/02 | (2006.01) |
| G05F 1/575 | (2006.01) |
| H04L 27/06 | (2006.01) |

(52) U.S. Cl.
CPC .............. *H03K 7/02* (2013.01); *H04B 14/023* (2013.01); *G05F 1/575* (2013.01); *H04L 27/06* (2013.01)

(58) Field of Classification Search
CPC ........ H03K 7/02; H04B 14/023; H04L 27/06; H04L 25/03057; H04L 25/03267
See application file for complete search history.

(56) References Cited

U.S. PATENT DOCUMENTS

| 6,208,168 B1 | 3/2001 | Rhee |
| 7,308,044 B2 | 12/2007 | Zerbe et al. |

(Continued)

OTHER PUBLICATIONS

Chang-Kyung Seong "A 10 GB/s adaptive Decision Feedback Equalizer with On-Chip Eye Opening Monitoring", Jan. 2011, pp. 1-135.*

(Continued)

*Primary Examiner* — Sophia Vlahos
(74) *Attorney, Agent, or Firm* — Volentine, Whitt & Francos, PLLC

(57) ABSTRACT

A transmitter includes: a pulse amplitude modulation encoder that encodes serial data to multi-bit transmission data of a first data group and a second data group; a first driver that converts first multi-bit transmission data of the first data group to a first differential signal having a first voltage swing width; a second driver that converts second multi-bit transmission data of the second data group to a second differential signal having a second voltage swing width narrower than the first voltage swing width; a first voltage regulator that provides to the second driver a first low swing voltage for generating the second differential signal; a second voltage regulator that provides to the second driver a second low swing voltage less than the first low swing voltage; and a constant current load switch that provides a current path between the first and second voltage regulators depending on deactivation of the second driver.

19 Claims, 12 Drawing Sheets

(56) References Cited

U.S. PATENT DOCUMENTS

| | | | |
|---|---|---|---|
| 7,397,848 | B2 | 7/2008 | Stojanovic et al. |
| 7,792,187 | B2 | 9/2010 | Bulzacchelli |
| 7,919,984 | B2 | 4/2011 | Balamurugan et al. |
| 8,576,903 | B2 | 11/2013 | Raphaeli et al. |
| 8,634,452 | B2 | 1/2014 | Zerbe et al. |
| 9,049,075 | B2 | 6/2015 | Juenemann et al. |
| 9,467,312 | B2 | 10/2016 | Ganzerli et al. |
| 9,509,535 | B2 | 11/2016 | Hollis |
| 9,531,570 | B2 | 12/2016 | Hekmat et al. |
| 9,559,880 | B1 | 1/2017 | Cirit et al. |
| 9,614,511 | B2 | 4/2017 | Blecher |
| 2007/0001704 | A1 | 1/2007 | O'Mahony |
| 2013/0241622 | A1 | 9/2013 | Zerbe et al. |
| 2016/0087821 | A1 | 3/2016 | Chen |
| 2016/0149730 | A1 | 5/2016 | Navid |
| 2016/0261435 | A1 | 9/2016 | Musah et al. |
| 2016/0344576 | A1 | 11/2016 | Francese |
| 2017/0033918 | A1 | 2/2017 | Hossain et al. |

OTHER PUBLICATIONS

Sam Palermo, ECEN620: Network Theory Broadband Circuit Design Fall 2014, Lecture 19: High-Speed Transmitters.

Vladimir Stojanović, A systems approach to building modern high-speed links, Integrated Systems Group Massachusetts Institute of Technology.

M. Bassi et al., A 45 Gb/s PAM-4 Transmitter Delivering 1.3Vppd Output Swing with 1V supply in 28nm CMOS FDSOI.

Jared L. Zerbe et al., Equalization and Clock Recovery for a 2.5-10-Gb/s 2-PAM/4-PAM Backplane Transceiver Cell, IEEE Journal of Solid-State Circuits, vol. 38, No. 12, Dec. 2003, p. 2121-2130.

Meisam Honarvar Nazari, Electrical and Optical Interconnects for High-Performance Computing, California Institute of Technology Pasadena, California, 2013 (Defended Apr. 17, 2013).

Azita Emami-Neyestanak et al., A 6.0-mW 10.0-Gb/s Receiver With Switched-Capacitor Summation DFE, IEEE Journal of Solid-State Circuits, vol. 42, No. 4, Apr. 2007, p. 889-896.

\* cited by examiner

PULSE AMPLITUDE MODULATION TRANSMITTER AND PULSE AMPLITUDE MODULATION RECEIVER

CROSS-REFERENCE TO RELATED APPLICATIONS

This is a Continuation of U.S. application Ser. No. 15/924,561, filed Mar. 19, 2018 which claims priority under 35 U.S.C. § 119 is made to Korean Patent Application No. 10-2017-0099847 filed on Aug. 7, 2017, in the Korean Intellectual Property Office, the entire contents of which are hereby incorporated by reference.

BACKGROUND

Embodiments of the inventive concept relate to a semiconductor device, and more particularly, relate to a pulse amplitude modulation transmitter and a pulse amplitude modulation receiver.

There is an increasing demand on transmitting a large amount of data at high speed as mobile devices are more extensively deployed and as Internet traffic rapidly increases. However, it is difficult to satisfy the demand for transmitting a large amount of data at high speed using a signaling technique that is based on non-return to zero (NRZ) encoding. In recent years, a pulse amplitude modulation (e.g., PAM4) signaling scheme has been actively developed as an alternative to NRZ signaling for transmitting a large amount of data at high speed.

The simplest way to improve energy efficiency in transmitting data by using a pulse amplitude modulation scheme is multi-bit signaling. It is known that an existing current-mode PAM4 transmitter consumes about four times more current than a voltage-mode PAM4 transmitter. The voltage-mode PAM4 transmitter has performed impedance matching by using an on-chip inductor. However, the range of data transmission speed of a transmitter is limited when using the on-chip inductor. Also, a relatively large chip area is needed to implement the transmitter. In addition, a general PAM4 receiver consumes current in a state where data are not received. When a decision feedback equalizer (DFE) for the PAM4 receiver is implemented, issues associated with RC loading, such as a speed limit and an increase in current, may occur.

SUMMARY

Embodiments of the inventive concept provide a transmitter and a receiver for pulse amplitude modulation.

According to one aspect, a pulse amplitude modulation transmitter includes: a pulse amplitude modulation encoder that encodes serial data to multi-bit transmission data included in any one of a first data group and a second data group; a first driver that converts first multi-bit transmission data included in the first data group to a first differential signal having a first voltage swing width; a second driver that converts second multi-bit transmission data included in the second data group to a second differential signal having a second voltage swing width narrower than the first voltage swing width; a first voltage regulator that provides to the second driver a first low swing voltage for generating the second differential signal; a second voltage regulator that provides to the second driver a second low swing voltage which is less than the first low swing voltage to the second driver; and a constant current load switch that provides a current path between the first voltage regulator and the second voltage regulator depending on deactivation of the second driver.

According to another aspect, a pulse amplitude modulation receiver receives a first input signal and a second input signal provided as a differential signal. The pulse amplitude modulation receiver includes: a first switched capacitor summer that adjusts levels of the first input signal and the second input signal and generates a first receive signal and a second receive signal as the adjustment result; a second switched capacitor summer that applies an offset to the levels of the first input signal and the second input signal and generates a third receive signal and a fourth receive signal as the applying result; a first comparator that determines a most significant bit (MSB) of reception data by using the first receive signal and the second receive signal, a second comparator that determines a first least significant bit value of the reception data by using the second receive signal and the third receive signal; and a third comparator configured to determine a second least significant bit value of the reception data by using the first receive signal and the fourth receive signal. Any one of the first least significant bit value and the second least significant bit value is selected as a least significant bit (LSB) of the reception data depending on a logical value of the MSB.

According to yet another embodiment, a device comprises: an input configured to receive serial data comprising a series of bit pairs; an encoder configured to encode each bit pair of the serial data into four driving signals, each of the four driving signals corresponding to one of four possible combinations of values of the bit pair, wherein when the bit pair has a combination of bit values corresponding to one of the four driving signals, then the corresponding one of the four driving signals has a value of a logic "1" and a remaining three of the four driving signals all have a value of a logic "0"; a pair of differential output terminals; a first driver configured to receive a first group of two of the driving signals from the encoder, wherein when the first group of two of the driving signals includes the one of the four driving signals which has a value of a logic "1" then the first driver is enabled to provide to the pair of differential output signals a first differential signal having a first voltage swing width, and wherein otherwise the first driver is disabled; and a second driver configured to receive a second group of two of the driving signals of the encoder, wherein when the second group of two of the driving signals includes the one of the four driving signals which has a value of a logic "1" then the second driver is enabled to provide to the pair of differential output signals a second differential signal having a second voltage swing width, and wherein otherwise the second driver is disabled, wherein the second voltage swing width is less than the first voltage swing width.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Figure 1:
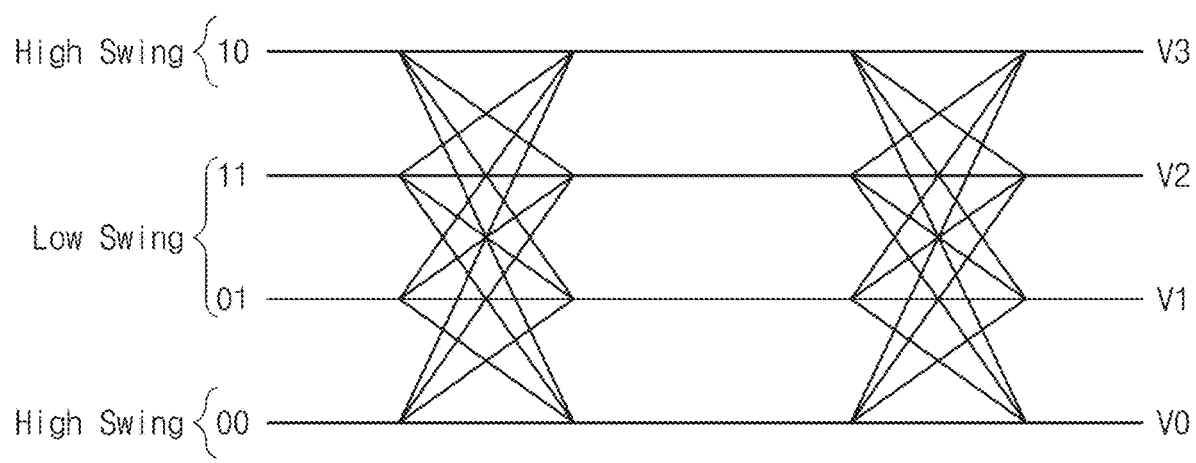
FIG. 1 is a view illustrating a transmit signal generated in a pulse amplitude modulation transmitter.

It is to be understood that both the foregoing general description and the following detailed description are provided as examples, for illustration and not for limiting the scope of the invention. Reference numerals will be represented in detail in embodiments of the inventive concept, examples of which are illustrated in the accompanying drawings. Wherever possible, the same reference numerals are used in the drawings and the description to refer to the same or similar parts.

As described below, PAM4 may be used as a signaling scheme of pulse amplitude modulation for describing features and functions of the inventive concept. However, one skilled in the art may easily understand other merits and performance of the inventive concept depending on the contents disclosed here. For example, a technology of the inventive concept may be applied to pulse amplitude modulation schemes of various levels. The inventive concept may be implemented or applied through other embodiments. In addition, the detailed description may be changed or modified according to view points and applications without departing from the claims, the scope and spirit, and any other purposes of the inventive concept.

FIG. 1 is a view illustrating a transmit signal generated in a PAM transmitter. Referring to FIG. 1, a PAM4 signal having four signal levels may be generated in a PAM transmitter.

The lowest voltage level V0 of the PAM4 signal may be mapped onto 2-bit data of "00". The highest voltage level V3 of the PAM4 signal may be mapped onto 2-bit data of "10". The lowest voltage level V0 and the highest voltage level V3 of the PAM4 signal correspond to a high swing (HS) level.

In addition, middle voltage levels V1 and V2 of the PAM4 signal may be mapped onto 2-bit data of "01" and "11", respectively. Each of the middle voltage levels V1 and V2 corresponding to 2-bit data of "01" and "11" may correspond to a low swing (LS) level. Mapping between the above-described voltage levels V0, V1, V2, and V3 and data may be gray code-based mapping. However, mapping between illustrated voltage levels and data bits shown in FIG. 1 is an example, and it may be understood that the mapping may be changed if so desired.

In the PAM4 transmitter described below, a driver to generate a signal of a low swing level and a driver to generate a signal of a high swing level may be separately provided. In addition, it may be understood that there may be provided three or more drivers capable of driving a plurality of voltage swings, as well as a low swing and a high swing, in a pulse amplitude modulation scheme.

Figure 2:
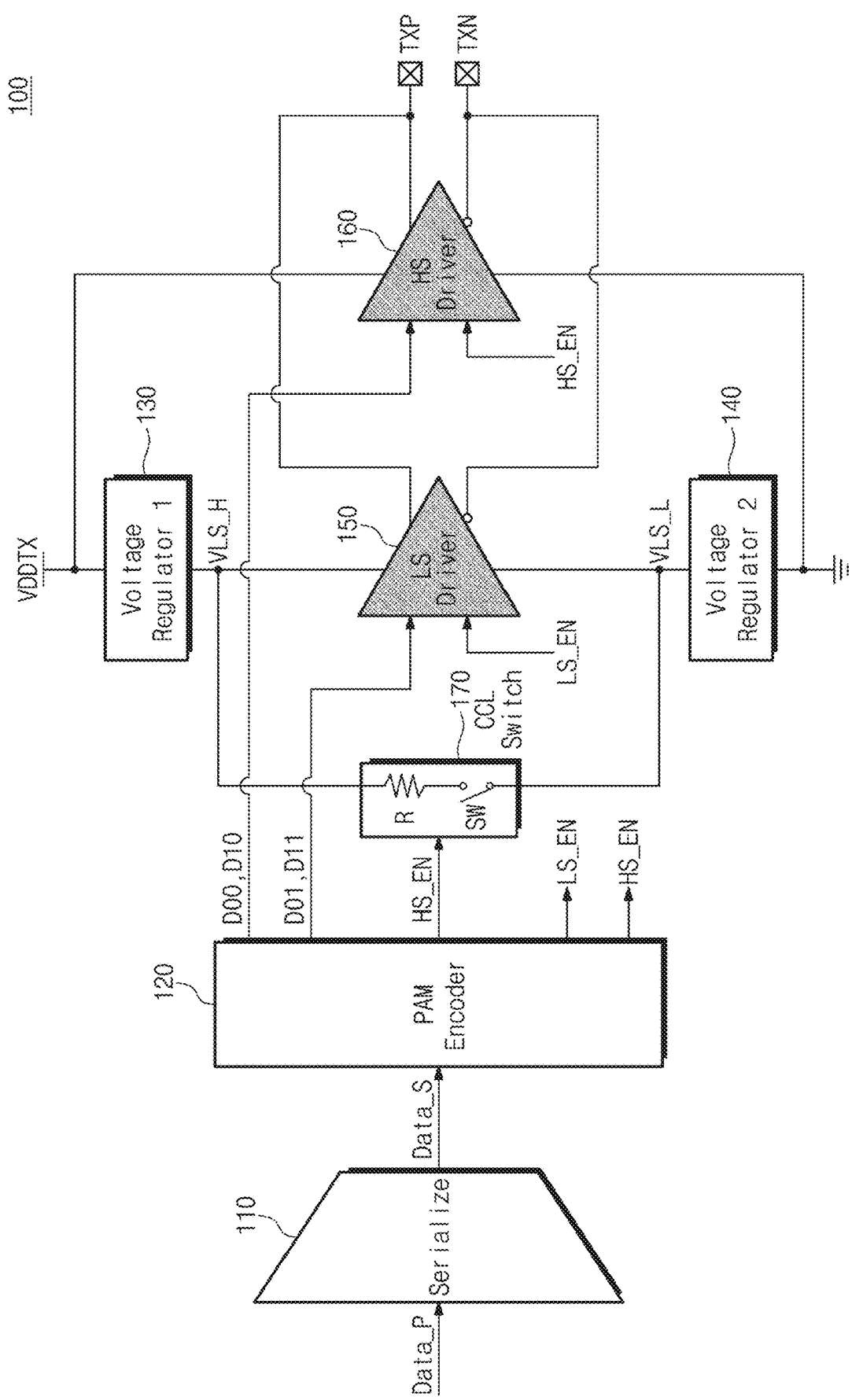
FIG. 2 is a block diagram illustrating an embodiment of a pulse amplitude modulation transmitter.

FIG. 2 is a block diagram illustrating an embodiment of a PAM transmitter. Referring to FIG. 2, a PAM transmitter 100 may include a serializer 110, a PAM encoder 120, a first voltage regulator 130, a second voltage regulator 140, a low swing driver 150, a high swing driver 160, and a constant current load switch 170.

Serializer 110 converts data Data_P to be transmitted to serial data Data_S of the form of continuous data streams. Here, the data Data_P may be provided from a processor or baseband units such as various data processing blocks. The serial data Data_S may be output in the form of continuous binary bits by serializer 110.

PAM encoder 120 encodes the data Data_S in a 2-bit unit. For example, PAM encoder 120 divides continuous data Data_S into 2-bit units. PAM encoder 120 generates a driving signal D00, D01, D11, or D10 corresponding to a logical value of each 2-bit unit. PAM encoder 120 transfers the generated driving signal to low swing driver 150 or high swing driver 160. For example, in the case where a logical value of 2-bit data is "00" or "10", PAM encoder 120 transfers the driving signal "D00" or "D10" to high swing driver 160. In the case where a logical value of 2-bit data is "01" or "11", PAM encoder 120 transfers the driving signal "D01" or "D11" to low swing driver 150.

In addition, in the case where PAM encoder 120 transfers the driving signal "D01" or "D11" to low swing driver 150, PAM encoder 120 may generate a first enable signal LS_EN for activating low swing driver 150. In the case where PAM encoder 120 transfers the driving signal "D00" or "D10" to high swing driver 160, PAM encoder 120 may generate a second enable signal HS_EN for activating high swing driver 160.

PAM encoder 120 may turn on constant current load switch 170 when high swing driver 160 is activated and low swing driver 150 is deactivated. In the case where PAM encoder 120 transfers the driving signal "D00" or "D10" to high swing driver 160, PAM encoder 120 may deactivate low swing driver 150 and, simultaneously, may turn on constant current load switch 170. If constant current load switch 170 is turned on, a current path between voltage regulators 130 and 140 is formed. In this case, even though a current path passing through low swing driver 150 is blocked, voltage regulators 130 and 140 may maintain a stable operation because a current path is formed through constant current load switch 170. To control constant current load switch 170, for example, PAM encoder 120 may use the second enable signal HS_EN. However, it should be understood that the first enable signal LS_EN, may be used to turn on or off constant current load switch 170 in another embodiment.

First voltage regulator 130 provides a first low swing voltage VLS_H to low swing driver 150. First voltage regulator 130 may be configured to output the first low swing voltage VLS_H corresponding to an optimum high signal level depending on a reference voltage Vref (not shown in FIG. 2), as discussed below with respect to FIG.

3. First voltage regulator 130 continuously generates the first low swing voltage VLS_H and provides the first low swing voltage VLS_H to low swing driver 150. That is, first voltage regulator 130 may continuously maintain an enable state even while low swing driver 150 does not generate a signal.

Second voltage regulator 140 provides a second low swing voltage VLS_L to low swing driver 150. Second voltage regulator 140 may be configured to output the second low swing voltage VLS_L corresponding to an optimum low signal level depending on the reference voltage Vref, as discussed below with respect to FIG. 4. Second voltage regulator 140 continuously generates the second low swing voltage VLS_L and provides the second low swing voltage VLS_L to low swing driver 150. That is, second voltage regulator 140 may continuously maintain an enable state even while low swing driver 150 does not generate a signal.

Low swing driver 150 generates a low swing signal corresponding to the driving signal "D01" or "D11" (the case where a logical value of 2-bit data is "01" or "11"). Low swing driver 150 generates a low swing signal having a low swing level (e.g., V1 and V2 of FIG. 1) by using the first and second low swing voltages VLS_H and VLS_L provided from voltage regulators 130 and 140. Low swing driver 150 generates a low swing signal in response to the first enable signal LS_EN from PAM encoder 120. Low swing driver 150 may transfer the generated low swing signal to output terminals TXP and TXN.

High swing driver 160 generates a high swing signal corresponding to the driving signal "D00" or "D10" (the case where a logical value of 2-bit data is "00" or "10"). High swing driver 160 generates a high swing signal of a high swing level (e.g., V0 and V3 of FIG. 1) by using transmission power supply voltages VDDTX and VSS (e.g., a ground voltage). High swing driver 160 generates a high swing signal in response to the second enable signal HS_EN from PAM encoder 120. High swing driver 160 may transfer the generated high swing signal to the output terminals TXP and TXN.

The low swing signal and the high swing signal are mutually exclusively transferred to the output terminals TXP and TXN. For example, the high swing signal may not exist at a point in time when the low swing signal is output. That is, at a point in time when low swing driver 150 outputs the low swing signal, high swing driver 160 may be deactivated, and the output terminals of high swing driver 160 may maintain a high-impedance state, and vice versa. At a point in time when high swing driver 160 outputs the high swing signal, low swing driver 150 may be deactivated, and the output terminals of low swing driver 150 may maintain a high-impedance state.

Constant current load switch 170 provides a current path between first voltage regulator 130 and second voltage regulator 140 under control of PAM encoder 120. While low swing driver 150 is activated, low swing driver 150 provides a current path between first voltage regulator 130 and second voltage regulator 140. However, a current path formed within low swing driver 150 is blocked while low swing driver 150 is deactivated. In this case, in the absence of constant current load switch 170, first voltage regulator 130 and second voltage regulator 140 may be deactivated, and thus, a relatively lot of time may be needed to make output voltage levels of voltage regulators 130 and 140 stable again. First voltage regulator 130 and second voltage regulator 140 may consume a fixed amount of current to maintain first voltage regulator 130 and second voltage regulator 140 stably. Constant current load switch 170 may provide a detour current path at a point in time when an internal current path of low swing driver 150 is blocked, to allow regulators 130 and 140 to maintain an output characteristic stably.

A structure of PAM transmitter 100 is briefly described above. PAM transmitter 100 includes low swing driver 150 and high swing driver 160, respectively. PAM transmitter 100 includes constant current load switch 170 for maintaining a constant current load of voltage regulators 130 and 140 at a point in time when low swing driver 150 is deactivated. The above-described structure makes it possible to implement high-speed, low-power voltage-mode PAM transmitter 100.

Figure 3:
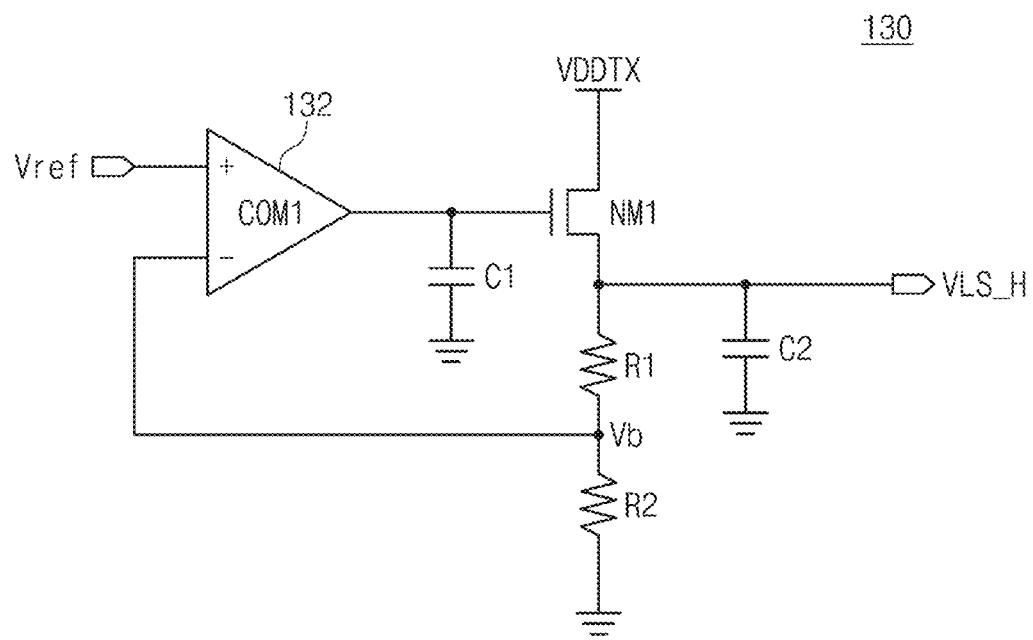
FIG. 3 is a circuit diagram schematically illustrating a possible circuit configuration of the first voltage regulator of FIG. 2.

FIG. 3 is a circuit diagram schematically illustrating a possible circuit configuration of first voltage regulator 130 of FIG. 2. Referring to FIG. 3, first voltage regulator 130 may include a comparator 132, an NMOS transistor NM1, capacitors C1 and C2, and voltage division resistors R1 and R2.

Comparator 132 compares the reference voltage Vref and a feedback voltage Vb to control the NMOS transistor NM1. The feedback voltage Vb is a voltage obtained by dividing the first low swing voltage VLS_H through the voltage division resistors R1 and R2. A change in the first low swing voltage VLS_H may be applied to comparator 132 through the feedback voltage Vb. If the feedback voltage Vb is greater than the reference voltage Vref, comparator 132 turns off the NMOS transistor NM1. If the feedback voltage Vb is less than the reference voltage Vref, the comparator 132 turns on the NMOS transistor NM1. The first low swing voltage VLS_H may continuously maintain a specific voltage level through switching of the NMOS transistor NM1. The capacitor C1 may stabilize an output of comparator 132, and the capacitor C2 functions as a low pass filter to stabilize a level of the first low swing voltage VLS_H.

Figure 4:
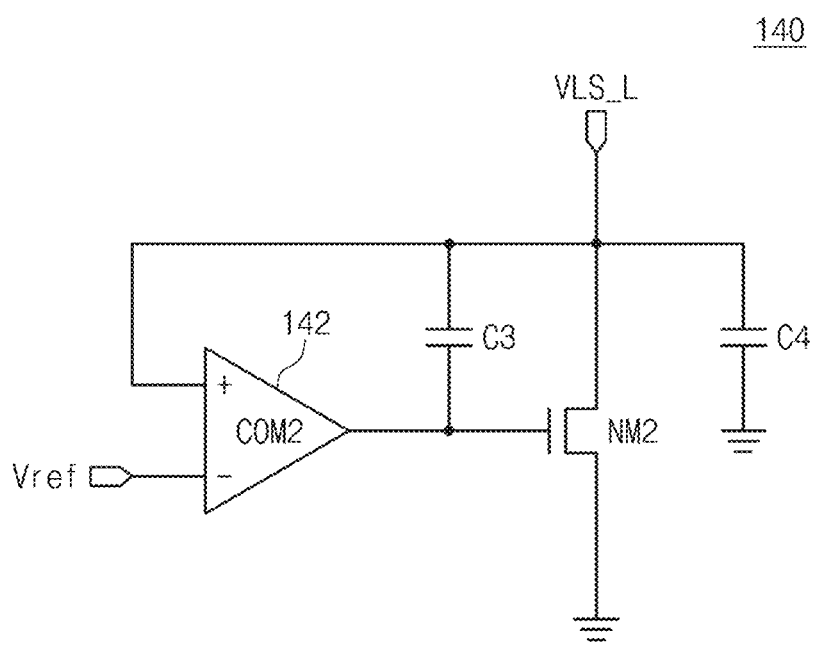
FIG. 4 is a circuit diagram schematically illustrating a possible circuit configuration of the second voltage regulator of FIG. 2.

FIG. 4 is a circuit diagram schematically illustrating a possible circuit configuration of second voltage regulator 140 of FIG. 2. Referring to FIG. 4, second voltage regulator 140 may include a comparator 142, an NMOS transistor NM2, and capacitors C3 and C4.

Comparator 142 compares the reference voltage Vref and the second low swing voltage VLS_L to control the NMOS transistor NM2. Unlike comparator 132 included in first voltage regulator 130, the second low swing voltage VLS_L fed back low is input to a positive input terminal (+) of comparator 142, and the reference voltage Vref is input to a negative input terminal (−) thereof. Accordingly, if the second low swing voltage VLS_L is greater than the reference voltage Vref, comparator 142 turns on the NMOS transistor NM2. In contrast, if the second low swing voltage VLS_L is less than the reference voltage Vref, comparator 142 turns off the NMOS transistor NM2. The capacitors C3 and C4 are configured to maintain the outputs of comparator 142 and second voltage regulator 140 stably. The second low swing voltage VLS_L may continuously maintain a specific voltage level through switching of the NMOS transistor NM2.

Figure 5:
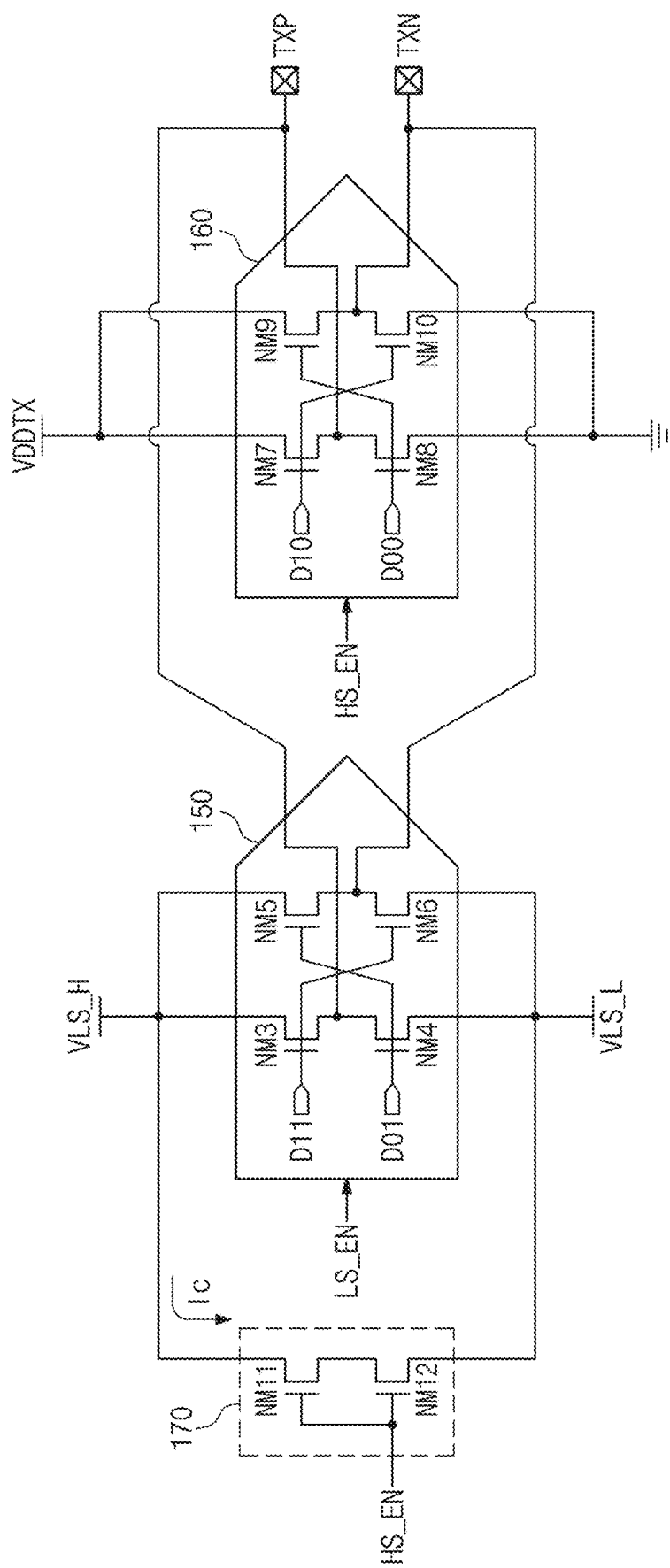
FIG. 5 is a circuit diagram illustrating a detailed configuration of a low swing driver, a high swing driver, and a constant current load switch of FIG. 2.

FIG. 5 is a circuit diagram illustrating a detailed configuration of a low swing driver, a high swing driver, and a constant current load switch of FIG. 2. Referring to FIG. 5, low swing driver 150 and high swing driver 160 perform a low output swing and a high output swing, respectively, depending on provided driving signals D00, D01, D11, and D10. In addition, low swing driver 150 and high swing driver 160 are mutually exclusively activated. In particular, constant current load switch 170 is turned on at a point in time when low swing driver 150 is deactivated, thereby making it possible to uniformly maintain a level of a load current flowing to voltage regulators 130 and 140.

Low swing driver 150 may be activated in response to a low swing enable signal (or a first enable signal) LS_EN. For example, in response to the low swing enable signal LS_EN, low swing driver 150 may transfer the first low swing voltage VLS_H and the second low swing voltage VLS_L to an output terminals TXP and TXN, or may block the first low swing voltage VLS_H and the second low swing voltage VLS_L from being transferred to the output terminals TXP and TXN. When low swing driver 150 is activated in response to a low swing enable signal (or a first enable signal) LS_EN, in response to the driving signals D01 and D11, low swing driver 150 switches the low swing voltages VLS_H and VLS_L so as to be transferred to the output terminals TXP and TXN.

Assume, for example, that that the driving signals D11 and D01 corresponding to 2-bit data of "11" and "01" are logically "1" and "0", respectively. In that case, NMOS transistors NM3 and NM6 are turned on by an input of logic "1" corresponding to the driving signal "D11". In contrast, NMOS transistors NM4 and NM5 are turned off by an input of logic "0" corresponding to the driving signal "D01". Accordingly, ideally, the first low swing voltage VLS_H may be transferred to the output terminal TXP. Also, ideally, the second low swing voltage VLS_L may be transferred to the output terminal TXN. However, in practice PAM signal voltages transferred to the output terminals TXP and TXN may decrease to a target voltage level by resistances distributed in elements and paths.

Now assume, for example, that that the driving signals D11 and D01 corresponding to 2-bit data of "11" and "01" are logically "0" and "1", respectively. In that case, NMOS transistors NM3 and NM6 are turned off by an input of logic "0" corresponding to the driving signal "D11". In contrast, NMOS transistors NM4 and NM5 are turned on by an input of logic "1" corresponding to the driving signal "D01". Accordingly, ideally, the second low swing voltage VLS_L may be transferred to the output terminal TXP. Also, ideally, the first low swing voltage VLS_H may be transferred to the output terminal TXN. However, in practice PAM signal voltages transferred to the output terminals TXP and TXN may decrease to a target voltage level by resistances distributed in elements and paths.

High swing driver 160 may be activated in response to a high swing enable signal (or a second enable signal) HS_EN. For example, in response to the high swing enable signal HS_EN, high swing driver 160 may output transmission power supply voltages VDDTX and VSS to output terminals TXP and TXN, or may block the transmission power supply voltages VDDTX and VSS (or "0V" also referred to as ground voltage) from being transferred to the output terminals TXP and TXN. In response to the driving signals D00 and D10 from PAM encoder 120, high swing driver 160 switches the transmission power supply voltages VDDTX and VSS so as to be transferred to the output terminals TXP and TXN.

Assume, for example, that the driving signals D00 and D10 corresponding to 2-bit data of "00" and "10" are logically "0" and "1", respectively. If the driving signal "D10" corresponding to 2-bit data of "10" is input as logic "1", then NMOS transistors NM7 and NM9 are turned on. In contrast, NMOS transistors NM8 and NM9, which are provided through gates thereof with logic "0" corresponding to the driving signal "D00", may be turned off. In this case, the transmission power supply voltage VDDTX may be transferred to the output terminal TXP by the NMOS transistor NM7. Also, the transmission power supply voltage VSS may be transferred to the output terminal TXN by the NMOS transistor NM10 being turned on. However, in practice PAM signal voltages transferred to the output terminals TXP and TXN may decrease to a target voltage level by resistances distributed in elements and paths.

Now assume, for example, that the driving signals D00 and D10 corresponding to 2-bit data of "00" and "10" are logically "1" and "0", respectively. If the driving signal "D10" corresponding to 2-bit data of "10" is input as logic "0", then NMOS transistors NM7 and NM10 are turned off. In contrast, NMOS transistors NM8 and NM9, which are provided through gates thereof with logic "1" corresponding to the driving signal "D00", may be turned on. In this case, the transmission power supply voltage VSS (i.e., ground) may be transferred to the output terminal TXP by the NMOS transistor NMB. Also, the transmission power supply voltage VDDTX may be transferred to the output terminal TXN by the NMOS transistor NM90 being turned on. However, in practice PAM signal voltages transferred to the output terminals TXP and TXN may decrease to a target voltage level by resistances distributed in elements and paths Constant current load switch 170 may be activated in response to the high swing enable signal HS_EN. That is, constant current load switch 170 is turned on in a period where low swing driver 150 is deactivated and high swing driver 160 is activated. In the case where the high swing enable signal HS_EN is activated (or at a logical "1" or "High"), NMOS transistors NM11 and NM12 of constant current load switch 170 are turned on. If the NMOS transistors NM11 and NM12 are turned on, a current path is formed between an output terminal of first voltage regulator 130 and an output terminal of second voltage regulator 140. Accordingly, a current path is formed between the output terminal of first voltage regulator 130 and the output terminal of second voltage regulator 140 at a point in time when low swing driver 150 is deactivated. Constant current load switch 170 may be implemented such that a current Ic flowing to the NMOS transistors NM11 and NM12 has substantially the same level as a current consumed by low swing driver 150.

An operation corresponding to each condition of constant current load switch 170 is briefly described above. As constant current load switch 170 is used, first voltage regulator 130 and second voltage regulator 140 may continuously maintain a constant current. Even though switching of low swing driver 150 and high swing driver 160 is made, first voltage regulator 130 and second voltage regulator 140 may maintain stable characteristics. Accordingly, it is possible to provide the first low swing voltage VLS_H and the second low swing voltage VLS_L having a stable level.

Figure 6:
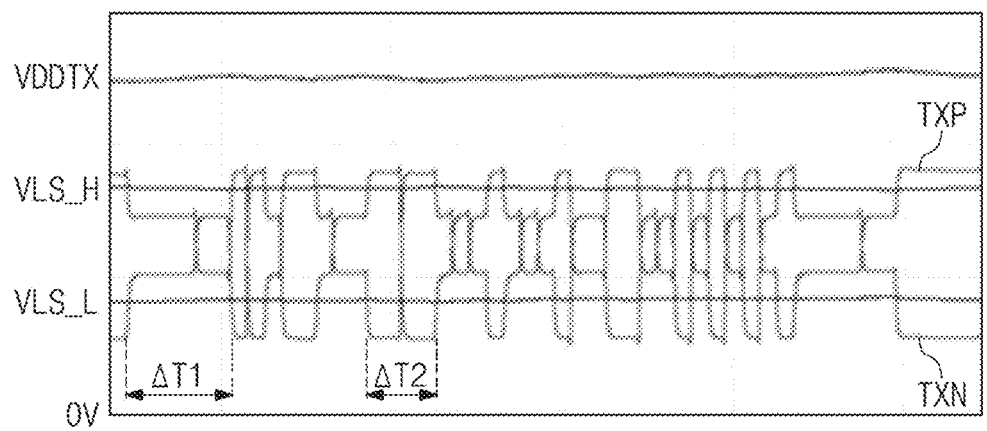
FIG. 6 is a timing diagram illustrating an output of an embodiment of a pulse amplitude modulation transmitter.

FIG. 6 is a timing diagram illustrating an output of an embodiment of a PAM transmitter. Referring to FIG. 6, at levels of the transmission power supply voltages VDDTX and "0V", PAM transmitter 100 continuously performs high swing and low swing operations to generate a PAM transmit signal.

The low swing operation is made between the first low swing voltage VLS_H that first voltage regulator 130 provides and the second low swing voltage VLS_L that second voltage regulator 140 provides. If high swing driver 160 is deactivated and low swing driver 150 is activated, a PAM transmit signal of the output terminals TXP and TXN swings between a level of the first low swing voltage VLS_H and a level of the second low swing voltage VLS_L. In an embodiment, in a period ΔT1 where the low swing enable signal LS_EN is activated, low swing driver 150 may generate the PAM transmit signal by using the first low swing voltage VLS_H and the second low swing voltage VLS_L. Accordingly, the PAM transmit signal swings between the first low swing voltage VLS_H and the second low swing voltage VLS_L at a point in time when the low swing enable signal LS_EN is activated.

In contrast, low swing driver 150 is deactivated in a period ΔT2 where the high swing enable signal HS_EN is activated. In this case, high swing driver 160 may generate the PAM transmit signal by using the transmission power supply voltages VDDTX and VSS. Accordingly, the PAM transmit signal swings between a level greater than the first low swing voltage VLS_H and a level less than the second low swing voltage VLS_L.

Figure 7:
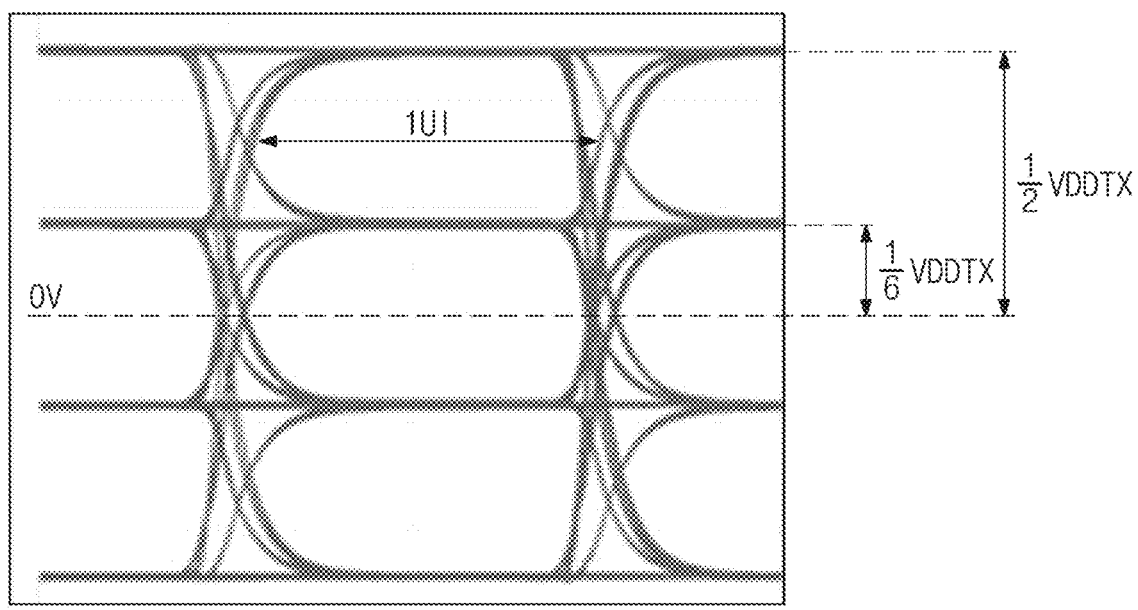
FIG. 7 is a view illustrating an eye pattern of a pulse amplitude modulation transmit signal of FIG. 6.

FIG. 7 is a view illustrating an eye pattern of a PAM transmit signal of FIG. 6. Referring to FIG. 7, an eye pattern of a PAM transmit signal provides a characteristic of an eye pattern in a typical PAM4 signal scheme by an efficient voltage swing of low swing driver 150 and high swing driver 160.

Referring to the eye pattern shown in FIG. 7 of the PAM transmit signal, an output transmit signal of a PAM4 signaling scheme may support four levels and may transmit 2-bit data per unit interval (UI). In contrast, NRZ may transfer only 1-bit data per UI. In an embodiment, in the PAM4 signaling scheme, four levels may form three eye diagrams. Since a transition from one level to another level has an influence on one or more eye patterns, eye patterns (or eye diagrams) may be interdependent.

A waveform and an eye pattern of a PAM transmit signal that PAM transmitter 100 generates are exemplified above. In PAM transmitter 100 implemented in a voltage mode manner, drivers 150 and 160 performing low swing and high swing operations may be separately provided, but a stable low swing voltage may be provided by an operation of constant current load switch 170. In addition, since PAM transmitter 100 is implemented in the voltage mode manner, it may be possible to markedly reduce power consumption.

Figure 8:
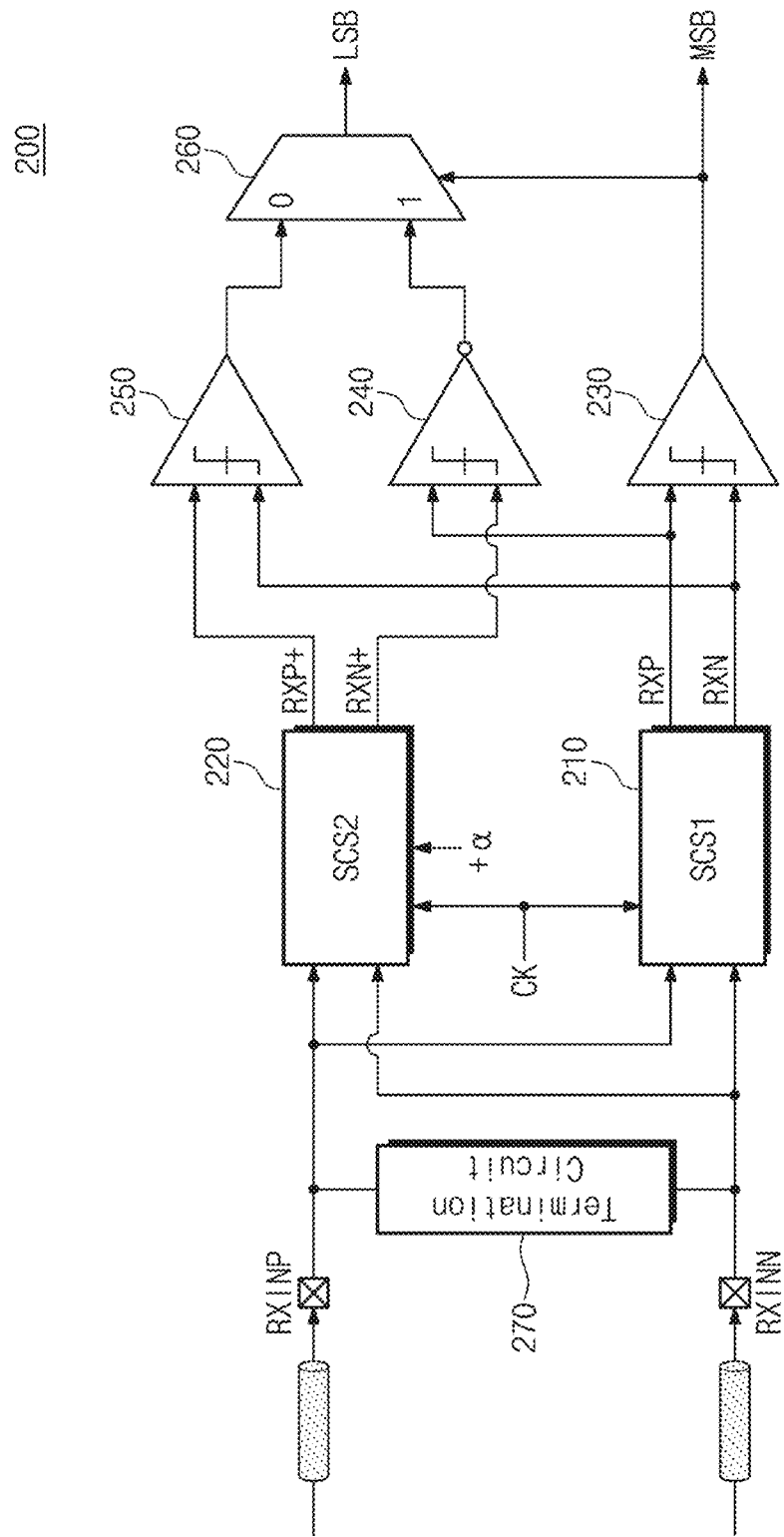
FIG. 8 is a block diagram illustrating an embodiment of a pulse amplitude modulation receiver.

FIG. 8 is a block diagram illustrating an embodiment of a PAM receiver. Referring to FIG. 8, a PAM receiver 200 may include a first switched capacitor summer 210, a second switched capacitor summer 220, a first comparator 230, a second comparator 240, and a third comparator 250, a multiplexer 260, and a termination circuit 270.

PAM input signals RXINP and RXINN transferred through transmission lines are transferred to input pads of PAM receiver 200. The PAM input signals RXINP and RXINN are transferred to first switched capacitor summer 210 and second switched capacitor summer 220 after being converted to voltage signals of preset levels by termination circuit 270.

First switched capacitor summer 210 generates first and second receive signals RXP and RXN from the PAM input signals RXINP and RXINN. Second switched capacitor summer 220 has the same structure as first switched capacitor summer 210 except that an offset "α" is applied thereto. The first and second receive signals RXP and RXN generated in first switched capacitor summer 210 are transferred to corresponding inputs of second and third comparators 240 and 250, respectively, for determining a least significant bit LSB, and are also each transferred to a corresponding input of first comparator 230 for determining a most significant bit MSB.

Second switched capacitor summer 220 receives the PAM input signals RXINP and RXINN to generate offset receive signals RXP+ and RXN+. Second switched capacitor summer 220 generates the third and fourth receive signals RXP+ and RXN+ that are obtained by applying the offset "α" to the PAM input signals RXINP and RXINN. To apply the offset "α", second switched capacitor summer 220 has a structure for capacitor switching and boosting of a voltage corresponding to the offset "α". Second switched capacitor summer 220 may use a clock signal CK for capacitor switching. The third and fourth receive signals RXP+ and RXN+ generated by second switched capacitor summer 220 are provided to corresponding inputs of second and third comparators 240 and 250 for determining the LSB. The structures of first and second switched capacitor summers 210 and 220 will be more fully described with reference to drawings to be described later.

First comparator 230 determines a logical value of the MSB of 2-bit data transferred in one unit interval UI. First comparator 230 determines a logical value of the MSB by using the first receive signal RXN and the second receive signal RXP to which an offset is not applied. A technique to determine a logical value of the MSB through first comparator 230 is substantially the same as a technique to determine a logical value by using levels of differential signals in a general NRZ-based receiver. The first receive signal RXN may have substantially a symmetrical relationship with the second receive signal RXP with respect to a center voltage. That is, the MSB of a 2-bit data unit transferred during one unit interval may be determined by using levels of the first receive signal RXN and the second receive signal RXP. For example, if a voltage of the second receive signal RXP is greater than an MSB reference voltage $V_{MSB}$, first comparator 230 may determine the MSB of PAM reception data of a 2 bit data unit as a logic "1".

Second comparator 240 determines a first least significant bit value of the 2-bit data unit transferred in one unit interval UI by using the second receive signal RXP, to which an offset is not applied, and the third receive signal RXN+ to which an offset is applied. The third receive signal RXN+ has a voltage level boosted by the offset "α" compared with the first receive signal RXN. Second comparator 240 may compare the second receive signal RXP and the third receive signal RXN+ boosted by the offset "α" and may output an inverted bit value of the first least significant bit value actually transferred as the comparison result. Accordingly, an inverter may be connected to an output terminal of second comparator 240 for the purpose of restoring the inverted value of the first least significant bit value. The first least significant bit value output by second comparator 240 may be valid as the LSB output by PAM receiver 200 when the MSB is logic "1". An LSB determining operation of second comparator 240 will be described with reference to FIG. 12.

Third comparator 250 determines a logical value of a second least significant bit value of a 2-bit data unit transferred in one unit interval UI by using the first receive signal RXN, to which an offset is not applied, and the fourth receive signal RXP+ to which an offset is applied. The fourth receive signal RXP+ has a voltage level boosted by the offset "α" compared with the second receive signal RXP. Third comparator 250 may compare the first receive signal RXN and the fourth receive signal RXP+ boosted by the offset "α" and may output the second least significant bit value as the comparison result. The second least significant bit value output by third comparator 250 may be valid as the LSB output by PAM receiver 200 when a logical value of the MSB determined by the first comparator 230 is "0".

Multiplexer 260 selects any one of outputs of second comparator 240 and third comparator 250, depending on a logical value of the MSB provided from first comparator 230. In the case where a logical value of the MSB determined by first comparator 230 is "0", multiplexer 260 outputs as the LSB the first least significant bit value that third comparator 250 determines. In contrast, in the case where a logical value of the MSB determined by first comparator 230 is "1", multiplexer 260 outputs as the LSB the second least significant bit value that second comparator 240 determines.

Termination circuit 270 may be implemented with an impedance circuit for matching an input impedance of PAM receiver 200. The PAM input signals RXINP and RXINN are transferred to first and second switched capacitor summers 210 and 220 as voltage signals by termination circuit 270. Termination circuit 270 may be implemented, for example, with impedance of 100Ω in the PAM4 signaling standard.

A structure of PAM receiver 200 is briefly described above. PAM receiver 200 may provide an offset to a PAM receive signal by using first and second switched capacitor summers 210 and 220 and may compare the results to determine a logical value of two or more bits. Accordingly, in the case where PAM receiver 200 is used, power consumption may be markedly reduced compared with a current mode receiver that consumes a fixed current to determine a logical value of a PAM receive signal.

Figure 9:
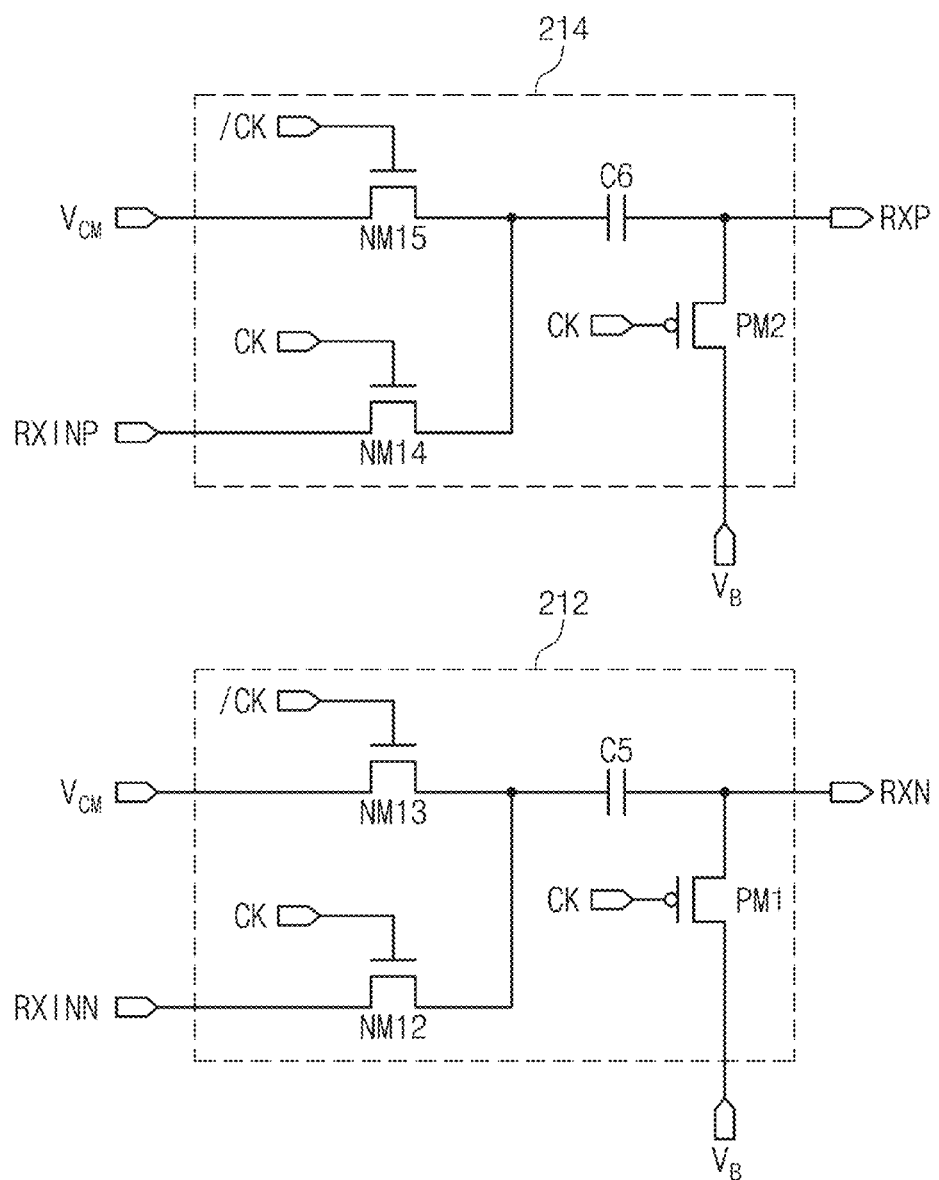
FIG. 9 is a circuit diagram illustrating a structure of a switched capacitor summer illustrated in FIG. 8.

FIG. 9 is a circuit diagram illustrating a structure of first switched capacitor summer 210 illustrated in FIG. 8. Referring to FIG. 9, first switched capacitor summer 210 includes a switched capacitor circuit 212 to generate the first receive signal RXN and a switched capacitor circuit 214 to generate the second receive signal RXP.

Switched capacitor circuit 212 may include a capacitor C5, NMOS transistors NM12 and NM13, and a PMOS transistor PM1. The NMOS transistor NM13 transfers a common mode voltage $V_{CM}$ to a first end of the capacitor C5 in response to an inverted clock signal/CK. The NMOS transistor NM12 transfers the PAM input signal RXINN to the first end of the capacitor C5 in response to a clock signal CK. The PMOS transistor PM1 transfers a base voltage $V_B$ to a second end of the capacitor C5 in synchronization with the clock signal CK.

In the case where the clock signal CK is at a high level, the PAM input signal RXINN is transferred to the first end of the capacitor C5. In the case where the inverted clock signal/CK transitions to a high level, the common mode voltage $V_{CM}$ is transferred to the first end of the capacitor C5. With the above description, in an ideal case, a voltage corresponding to a sum of the common mode voltage $V_{CM}$ and a voltage of the PAM input signal RXINN is charged in the capacitor C5, and the first receive signal RXN of a level boosted by the base voltage $V_B$ by the PMOS transistor PM1 may be output. A level of the common mode voltage $V_{CM}$ or the base voltage $V_B$ may be determined in advance to have a voltage value capable of providing optimal reliability.

Switched capacitor circuit 214 may include a capacitor C6, NMOS transistors NM14 and NM15, and a PMOS transistor PM2. The NMOS transistor NM15 transfers the common mode voltage $V_{CM}$ to a first end of the capacitor C6 in response to the inverted clock signal/CK. The NMOS transistor NM14 transfers the PAM input signal RXINP to the first end of the capacitor C6 in response to the clock signal CK. The PMOS transistor PM2 transfers the base voltage $V_B$ to a second end of the capacitor C6 in synchronization with the clock signal CK.

In the case where the clock signal CK is at a high level, the PAM input signal RXINP is transferred to the first end of the capacitor C6. In the case where the inverted clock signal/CK transitions to a high level, the common mode voltage $V_{CM}$ is transferred to the first end of the capacitor C6. With the above description, in an ideal case, a voltage corresponding to a sum of the common mode voltage $V_{CM}$ and a voltage of the PAM input signal RXINP is maintained in the capacitor C6, and the second receive signal RXP of a level boosted by the base voltage $V_B$ by the PMOS transistor PM2 may be output.

Figure 10:
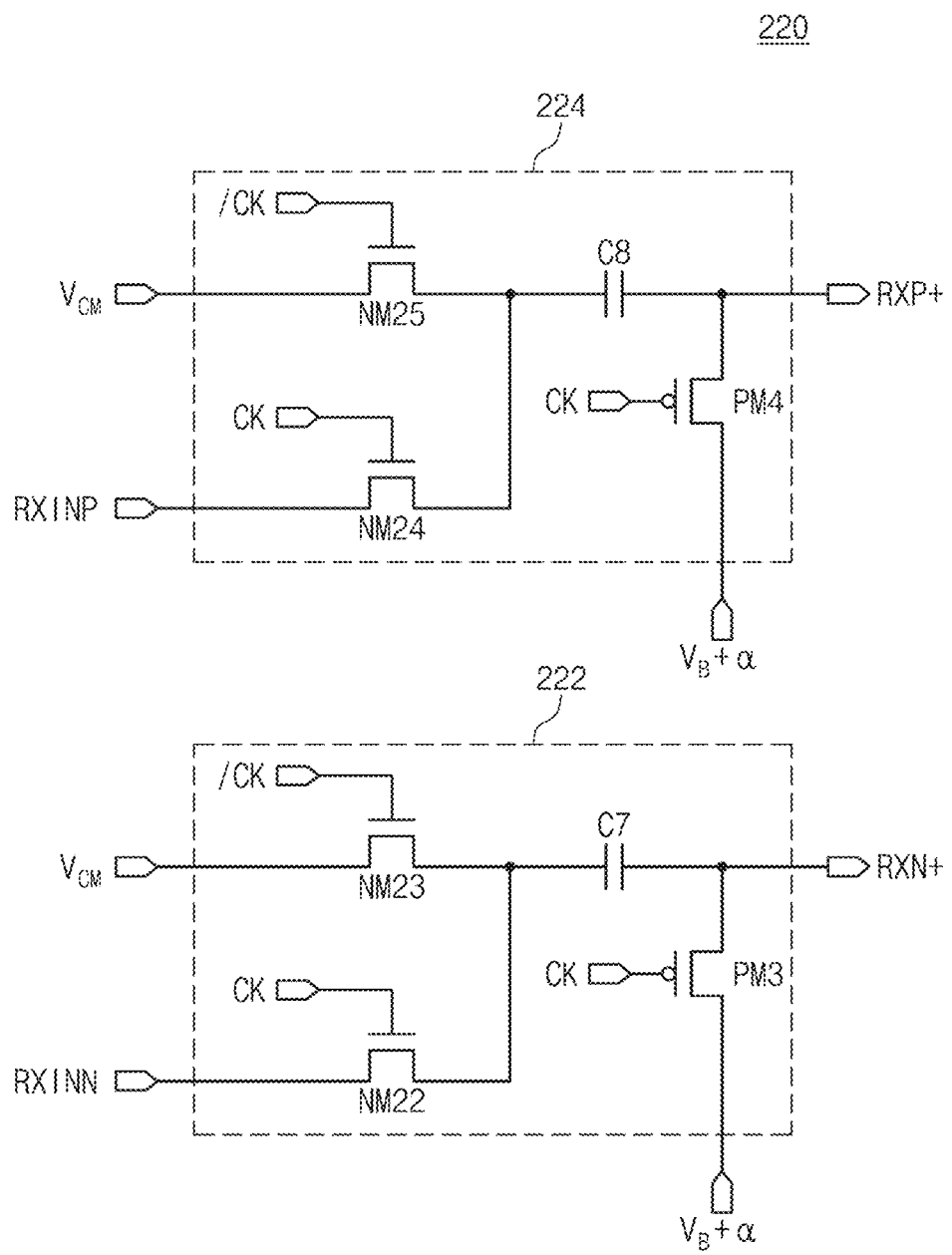
FIG. 10 is a circuit diagram illustrating a second switched capacitor summer of FIG. 8.

FIG. 10 is a circuit diagram illustrating a second switched capacitor summer 220 of FIG. 8. Referring to FIG. 10, second switched capacitor summer 220 includes a switched capacitor circuit 222 to generate the third receive signal RXN+ and a switched capacitor circuit 224 to generate the fourth receive signal RXP+.

Switched capacitor circuit 222 may include a capacitor C7, NMOS transistors NM22 and NM23, and a PMOS transistor PM3. The NMOS transistor NM23 transfers the common mode voltage $V_{CM}$ to a first end of the capacitor C7 in response to the inverted clock signal/CK. The NMOS transistor NM22 transfers the PAM input signal RXINN to the first end of the capacitor C7 in response to the clock signal CK. The PMOS transistor PM3 transfers the base voltage ($V_B$+a) for applying the offset "α", to a second end of the capacitor C7 in synchronization with the clock signal CK.

In the case where the clock signal CK is at a high level, the PAM input signal RXINN is transferred to the first end of the capacitor C7. In the case where the inverted clock signal/CK transitions to a high level, the common mode voltage $V_{CM}$ is transferred to the first end of the capacitor C7. With the above description, a voltage corresponding to a sum of the common mode voltage $V_{CM}$ and a voltage of the PAM input signal RXINN is charged in the capacitor C7, and the third receive signal RXN+ of a level boosted by the base voltage ($V_B$+a) by the PMOS transistor PM3 may be output.

Switched capacitor circuit 224 may include a capacitor C8, NMOS transistors NM24 and NM25, and a PMOS transistor PM4. The NMOS transistor NM25 transfers the common mode voltage $V_{CM}$ to a first end of the capacitor C8 in response to the inverted clock signal/CK. The NMOS transistor NM24 transfers the PAM input signal RXINP to the first end of the capacitor C8 in response to the clock signal CK. The PMOS transistor PM4 transfers the base voltage ($V_B$+a) to a second end of the capacitor C8 in synchronization with the clock signal CK.

In the case where the clock signal CK is at a high level, the PAM input signal RXINP is transferred to the first end of the capacitor C8. In the case where the inverted clock signal/CK transitions to a high level, the common mode voltage $V_{CM}$ is transferred to the first end of the capacitor C8. With the above description, a voltage corresponding to a sum of the common mode voltage $V_{CM}$ and a voltage of the PAM input signal RXINP is charged in the capacitor C8, and the fourth receive signal RXP+ of a level boosted by the base voltage ($V_B$+α) by the PMOS transistor PM4 may be output.

Figure 11:
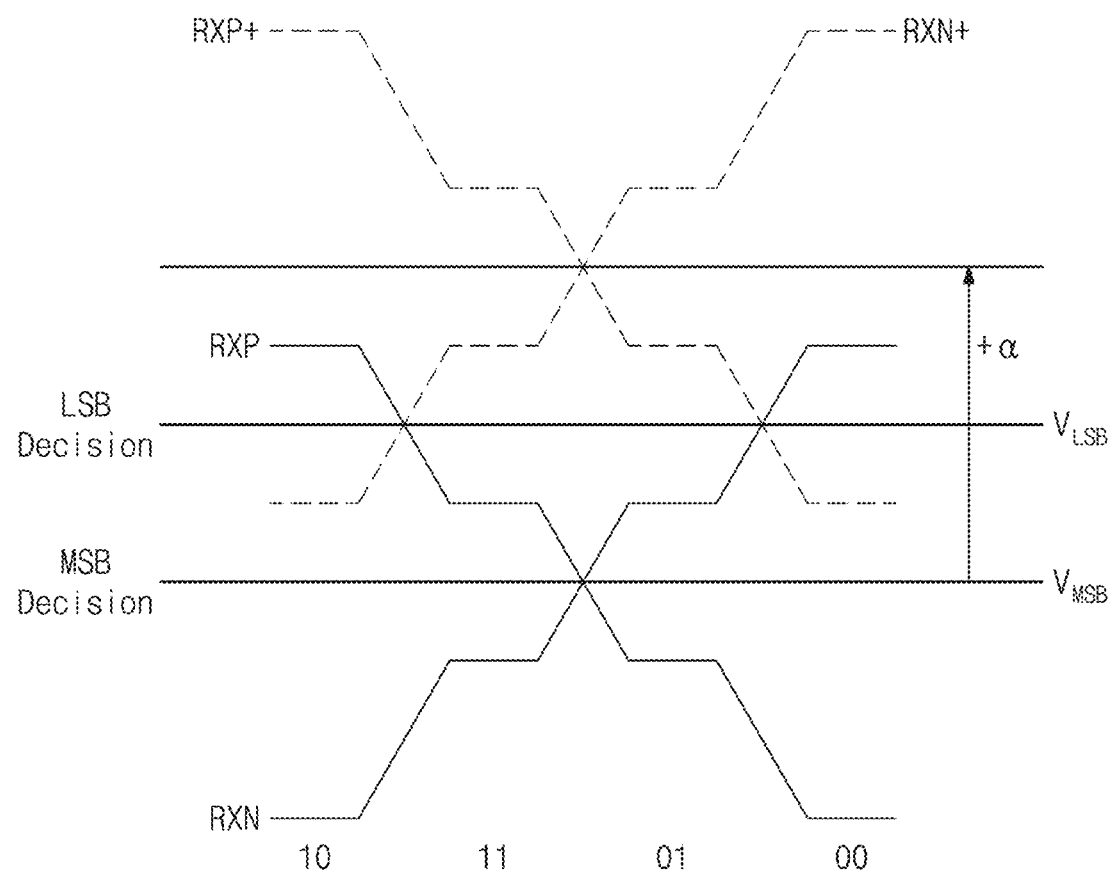
FIG. 11 is a waveform diagram illustrating examples of receive signals of a PAM receiver.

FIG. 11 is a waveform diagram illustrating examples of receive signals of a PAM receiver. Referring to FIG. 11, there are illustrated the first and second receive signals RXN and RXP of a default level and the third and fourth receive signals RXN+ and RXP+ to which the offset "α" is applied.

The first and second receive signals RXN and RXP provided by first switched capacitor summer 210 have a voltage level to which an offset is not applied. Here it is assumed that the first and second receive signals RXN and RXP are provided sequentially having voltage levels corresponding to 2-bit data "10", "11", "01", and "00". The first and second receive signals RXN and RXP are used for a comparison operation for determining an MSB transferred to first comparator 230 (refer to FIG. 8). For example, in the case where a voltage of the second receive signal RXP is greater than the MSB reference voltage $V_{MSB}$, the MSB may be determined to be a logic "1". In contrast, in the case where a voltage of the second receive signal RXP is less than the MSB reference voltage $V_{MSB}$, the MSB may be determined to be a logic "0".

Signals for determining a logical value of an LSB are determined depending on a logical value of the MSB. In the case where a logical value of the MSB is a logic "1", the second receive signal RXP and the third receive signal RXN+ are used to determine the LSB. However, in the case where a logical value of the MSB is logic "0", the first receive signal RXN and the fourth receive signal RXP+ are used to determine the LSB.

To determine a logical value of the LSB, the selected receive signals may be compared with an LSB reference voltage $V_{LSB}$. It is assumed that the first receive signal RXN and the fourth receive signal RXP+ are selected to determine a logical value of the LSB as the MSB is determined as logic "0". In this case, if a voltage of the fourth receive signal RXP+ is greater than the LSB reference voltage $V_{LSB}$, a logical value of the LSB may be determined to be a "1". Accordingly, 2-bit reception data may be determined to be a logical value of "01".

It is assumed that the second receive signal RXP and the third receive signal RXN+ are selected to determine a logical value of the LSB as the MSB is determined to be a logic "1". In this case, if a voltage of the second receive signal RXP is less than the LSB reference voltage $V_{LSB}$, a logical value of the LSB may be determined to be a "1"; if a voltage of the second receive signal RXP is greater than the LSB reference voltage $V_{LSB}$, then a logical value of the LSB may be determined to be a "0".

Figure 12:
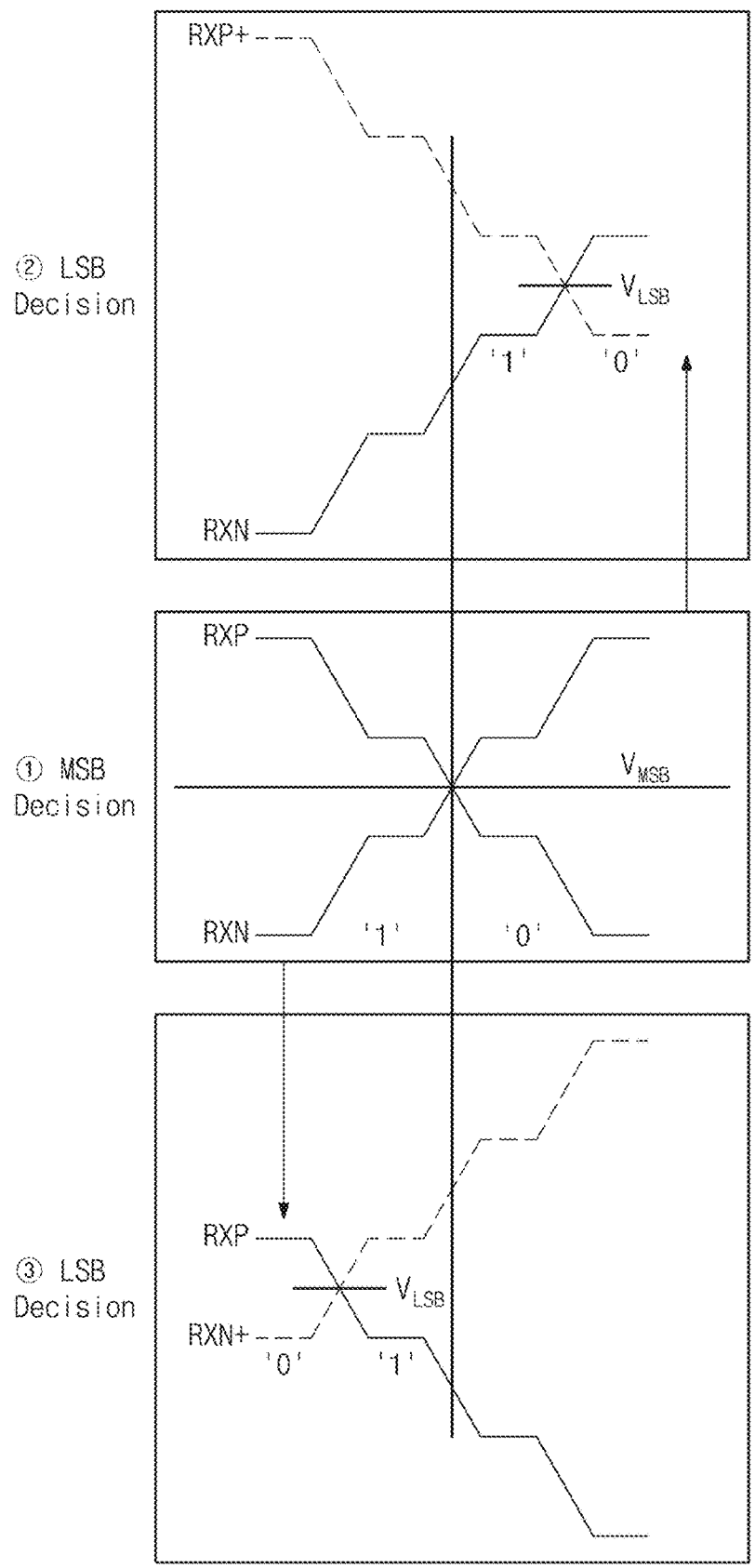
FIG. 12 is a view illustrating a determination operation performed in an embodiment of a pulse amplitude modulation receiver.

FIG. 12 is a view illustrating a determination operation performed in a PAM receiver. Referring to FIG. 12, PAM receiver 200 generates the first to fourth receive signals RXN, RXP, RXN+, and RXP+ from a received PAM signal by selectively applying an offset thereto. The PAM receiver compares the first to fourth receive signals RXN, RXP, RXN+, and RXP+ to determine the 2-bit reception data.

First, PAM receiver 200 determines an MSB by using the first and second receive signals RXN and RXP. This process is illustrated in detail in FIG. 12 as a process①. If a voltage of the second receive signal RXP is greater than an MSB reference voltage $V_{MSB}$ (the left with respect to the center), PAM receiver 200 may determine a logical value of the MSB to be a logic "1". In contrast, if a voltage of the second receive signal RXP is less than an MSB reference voltage $V_{MSB}$ (the right with respect to the center), PAM receiver 200 may determine a logical value of the MSB to be a logic "0".

If the MSB determined by first comparator 230 is a logic "1", the third receive signal RXN+ and the second receive signal RXP may be used to determine a logical value of an LSB. That is, the first least significant bit value determined by second comparator 240 is selected as the LSB. The manner in which the first least significant bit value (which becomes the LSB when the MSB is a logic "0") is determined is illustrated in FIG. 12 as a process③. That is, if a voltage of the second receive signal RXP is greater than the LSB reference voltage $V_{LSB}$, a logical value of the LSB may be determined to be a "0"; if a voltage of the second receive signal RXP is lower than the LSB reference voltage $V_{LSB}$, a logical value of the LSB may be determined to be a "1".

If the MSB determined by first comparator 230 is a logic "0", the first receive signal RXN and the fourth receive signal RXP+ may be used to determine a logical value of the LSB. That is, the second least significant bit value determined by third comparator 250 is selected as the LSB. The manner in which the second least significant bit value (which becomes the LSB when the MSB is a logic "0") is determined is illustrated in FIG. 12 as a process②. If a voltage of the fourth receive signal RXP+ is greater than the LSB reference voltage $V_{LSB}$, a logical value of the second least significant bit value may be determined to be a "1"; if a voltage of the fourth receive signal RXP+ is less than the LSB reference voltage $V_{LSB}$, a logical value of the LSB may be determined to be a "0".

As described above, PAM receiver 200 may determine the MSB and the LSB by using voltage levels of received PAM signals. Accordingly, power consumption may be reduced compared with a general PAM receiver that consumes a fixed current in a period where data are not transmitted.

Figure 13:
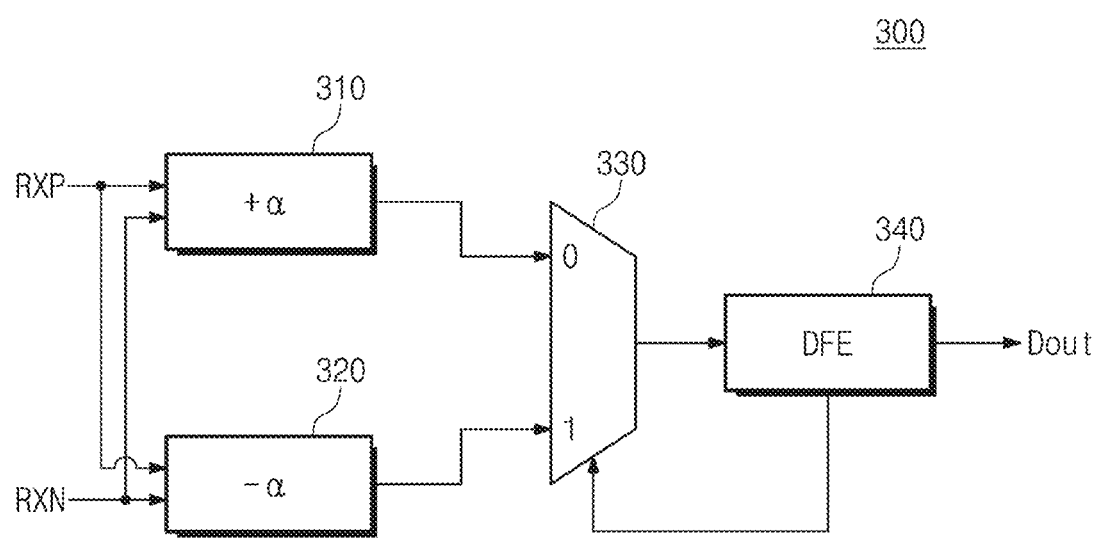
FIG. 13 is a block diagram illustrating a structure of another embodiment of a pulse amplitude modulation receiver.

FIG. 13 is a block diagram illustrating a structure of another embodiment of a PAM receiver. Referring to FIG. 13, a PAM receiver 300 may selectively apply an offset to the receive signals RXP and RXN depending on a pattern of received data. PAM receiver 300 may include offset applying units 310 and 320, a multiplexer 330, and a determination feedback equalizer 340.

Offset applying units 310 and 320 are configured to apply offsets +α and −α of a fixed level to the receive signals RXN and RXP. A circuit structure for applying offsets to the receive signals RXN and RXP may be implemented to be similar to second switched capacitor summer 220 described above with reference to FIG. 10. First offset applying unit 310 may process the receive signals RXN and RXP in a way to add an offset to the receive signals RXN and RXP. Second offset applying unit 320 may process the receive signals RXN and RXP in a way to subtract an offset from the receive signals RXN and RXP.

Multiplexer 330 may select any one of outputs of offset applying units 310 and 320. In particular, multiplexer 330 may select any one of offset applying units 310 and 320 depending on a pattern of reception data detected by determination feedback equalizer 340.

Determination feedback equalizer 340 filters data of a received signal and outputs the filtered result as output data Dout. In particular, determination feedback equalizer 340 may detect a pattern of the determined output data Dout to determine a magnitude or kind of an offset to be applied to the receive signals RXN and RXP.

Figure 14A:
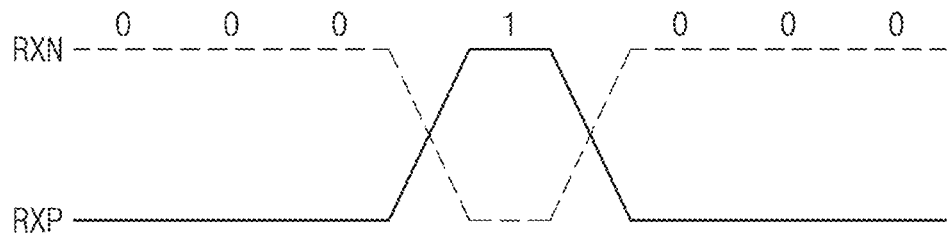
FIGS. 14A, 14B and 14C are timing diagrams illustrating an embodiment of a method for selecting an offset depending on a data pattern.
Figure 14B:
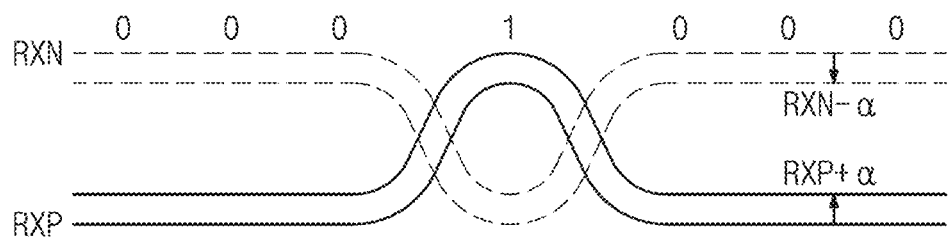
Figure 14C:
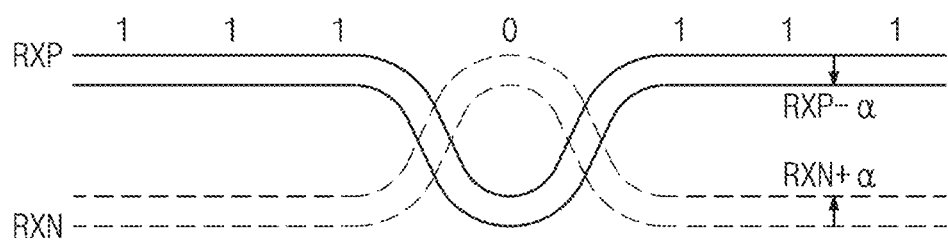

FIGS. 14A, 14B and 14C are timing diagrams illustrating an embodiment of a method for selecting an offset depending on a data pattern. FIG. 14A illustrates a waveform of a transmit signal corresponding to a specific data pattern of "0001000". FIG. 14B illustrates a waveform of a receive signal corresponding to a transmit signal of FIG. 14A.

Referring to FIG. 14B, in a period corresponding to logic "1", the reliability of data becomes higher as a differential value between the receive signals RXN and RXP increases. Accordingly, it may be possible to improve the reliability of reception data through an offset processing technique to add the offset "α" to the receive signal RXP. Alternatively, it may be possible to improve the reliability of reception data through an offset processing technique to subtract the offset "α" from the receive signal RXN.

FIG. 14C illustrates an offset processing method implementable in the case where a data pattern is opposite to a data pattern illustrated in FIG. 14B. In the case of a data pattern such as "1110111", offset processing for increasing a differential value between the receive signals RXN and RXP is possible in a period corresponding to logic "1". Accordingly, it may be possible to improve the reliability of reception data through an offset processing technique to subtract the offset "α" from the receive signal RXP. Alternatively, it may be possible to improve the reliability of reception data through an offset processing technique to add the offset "α" to the receive signal RXN. Alternatively, it may be possible to apply both the processing technique to add the offset "α" and the processing way to subtract the offset "α".

A method for applying an offset to a PAM receive signal depending on a data pattern is briefly described above. Applying an offset depending on a data pattern may be individually applied to LSB data and MSB data in a PAM4 receiver. In addition, although not illustrated in drawings, it may be understood that it is possible to set an equalizer depending on a data pattern even in a PAM transmitter.

According to an embodiment, it may be possible to implement a low-power pulse amplitude modulation (PAM4) transmitter and receiver occupying a small chip area.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A pulse amplitude modulation receiver which is configured to receive a first input signal and a second input signal provided as a differential signal, the pulse amplitude modulation receiver comprising:
   a first switched capacitor summer configured to adjust levels of the first input signal and the second input signal and to generate therefrom a first receive signal and a second receive signal;
   a second switched capacitor summer configured to apply an offset to the levels of the first input signal and the second input signal and to generate a third receive signal and a fourth receive signal as a result;
   a first comparator configured to determine a most significant bit (MSB) of reception data by using the first receive signal and the second receive signal;
   a second comparator configured to determine a first least significant bit value of the reception data by using the second receive signal and the third receive signal; and
   a third comparator configured to determine a second least significant bit value of the reception data by using the first receive signal and the fourth receive signal,
   wherein any one of the first least significant bit value and the second least significant bit value is selected as a least significant bit (LSB) of the reception data depending on a logical value of the MSB.

2. The pulse amplitude modulation receiver of claim 1, wherein the third receive signal has a signal level obtained by adding the offset to the first receive signal, and the fourth receive signal has a signal level obtained by adding the offset to the second receive signal.

3. The pulse amplitude modulation receiver of claim 1 wherein the first comparator determines the MSB as logic "1" when a voltage of the first receive signal is greater than a first reference voltage and a voltage of the second receive signal is less than the first reference voltage.

4. The pulse amplitude modulation receiver of claim 3, wherein the second comparator determines the first least significant bit value to be a logic "0" when a voltage of the second receive signal is greater than a second reference voltage and a voltage of the third receive signal is less than the second reference voltage, the second reference voltage being greater than the first reference voltage.

5. The pulse amplitude modulation receiver of claim 4, wherein the third comparator determines the second least significant bit value to be a logic "1" when a voltage of the fourth receive signal is greater than the second reference voltage and a voltage of the first receive signal is less than the second reference voltage.

6. The pulse amplitude modulation receiver of claim 1, further comprising:
   a multiplexer configured to select any one of the first least significant bit value and the second least significant bit value as the LSB depending on the logical value of the MSB.

7. The pulse amplitude modulation receiver of claim 1, wherein the first switched capacitor summer includes:
   a first switched capacitor circuit configured to adjust the level of the first input signal and to output the first receive signal in response thereto; and
   a second switched capacitor circuit configured to adjust the level of the second input signal and to output the second receive signal in response thereto.

8. The pulse amplitude modulation receiver of claim 7, wherein the second switched capacitor summer includes:
   a third switched capacitor circuit configured to adjust the level of the first input signal, to add the offset to the adjusted first input signal, and in response thereto to output the third receive signal; and
   a fourth switched capacitor circuit configured to adjust the level of the second input signal, to add the offset to the adjusted second input signal, and in response thereto to output the fourth receive signal.

9. The pulse amplitude modulation receiver of claim 8, wherein the third switched capacitor circuit includes:
   a capacitor;
   a first switch configured to transfer the first input signal to a first end of the capacitor in synchronization with a clock signal;
   a second switch configured to transfer a common mode voltage to the first end of the capacitor in synchronization with an inverted clock signal; and
   a third switch configured to transfer a voltage corresponding to the offset to a second end of the capacitor in synchronization with the clock signal.

10. The pulse amplitude modulation receiver of claim 1, further comprising:
    a termination circuit for matching an input impedance of the pulse amplitude modulation receiver.

11. A pulse amplitude modulation receiver which is configured to receive a first receive signal and a second receive signal provided as a differential signal, the pulse amplitude modulation receiver comprising:
    a first offset applier receiving the first receive signal and the second receive signal to add a first offset to the first receive signal and to add the first offset to the second receive signal;
    a second offset applier receiving the first receive signal and the second receive signal to subtract a second offset from the second receive signal and to subtract the second offset from the second receive signal;
    a multiplexer selecting either an output of the first offset applier or an output of the second offset applier in response to an selection signal; and
    a determination feedback equalizer configured to filter an output of the multiplexer to generate output data, and configured to detect a pattern of the output data to generate the selection signal.

12. The pulse amplitude modulation receiver of claim 11, wherein the first offset is an equal voltage level to the second offset.

13. The pulse amplitude modulation receiver of claim 11, wherein the pattern of the output data corresponds to a data pattern of '00100' or '11011'.

14. The pulse amplitude modulation receiver of claim 13, wherein when the data pattern corresponds to '00100', the determination feedback equalizer generates the selection signal to select the output of the first offset applier.

15. The pulse amplitude modulation receiver of claim 14, wherein when the data pattern corresponds to '11011', the determination feedback equalizer generates the selection signal to select the output of the second offset applier.

16. A method of receiving a pulse amplitude modulation signal which includes a first receive signal and a second receive signal provided as a differential signal, the method comprising:

receiving the first receive signal and the second receive signal;

adding a first offset to the first receive signal and to the second receive signal to generate a first differential signal;

subtracting a second offset from the first receive signal and from the second receive signal to generate a second differential signal;

selecting one of the first differential signal and the second differential signal based on a pattern of an output data;

filtering the selected differential signal to generate the output data; and detecting the pattern of the output data.

17. The method of claim 16, wherein the pattern of the output data corresponds to a data pattern of '00100' or '11011'.

18. The method of claim 17, wherein when the data pattern corresponds to '00100', the first differential signal is selected to generate the output data.

19. The method of claim 17, wherein when the data pattern corresponds to '11011', the second differential signal is selected to generate the output data.

* * * * *